US011219131B2

(12) United States Patent
Bae

(10) Patent No.: US 11,219,131 B2
(45) Date of Patent: Jan. 4, 2022

(54) PLATING HANGER DEVICE HAVING SHOCK-ABSORBING STRUCTURE

(71) Applicants: NEOPMC CO., LTD., Ansan-si (KR); Min-Su Bae, Incheon (KR)

(72) Inventor: Min-Su Bae, Incheon (KR)

(73) Assignees: NEOPMC CO., LTD., Ansan-si (KR); Min-Su Bae, Incheon (KR)

( * ) Notice: Subject to any disclaimer, the term of this patent is extended or adjusted under 35 U.S.C. 154(b) by 87 days.

(21) Appl. No.: 16/618,541

(22) PCT Filed: Oct. 13, 2017

(86) PCT No.: PCT/KR2017/011296
§ 371 (c)(1),
(2) Date: Dec. 2, 2019

(87) PCT Pub. No.: WO2018/221792
PCT Pub. Date: Dec. 6, 2018

(65) Prior Publication Data
US 2020/0093005 A1    Mar. 19, 2020

(30) Foreign Application Priority Data

May 30, 2017  (KR) .......................... 10-2017-0066878

(51) Int. Cl.
*C25D 17/08* (2006.01)
*H05K 3/24* (2006.01)
*C25D 11/00* (2006.01)

(52) U.S. Cl.
CPC ........... *H05K 3/241* (2013.01); *C25D 11/005* (2013.01); *C25D 17/08* (2013.01)

(58) Field of Classification Search
None
See application file for complete search history.

(56) References Cited

U.S. PATENT DOCUMENTS 6,016,817 A * 1/2000 Henig .................... C25D 21/10
134/1.2

FOREIGN PATENT DOCUMENTS

CN       102383167     *  3/2012   ............. C25D 17/00
JP       2001206220    *  7/2001   ............. B23P 19/00
(Continued)

OTHER PUBLICATIONS

English translation KR 20110085281, Jul. 27, 2011. (Year: 2011).*

*Primary Examiner* — Stefanie S Wittenberg
(74) *Attorney, Agent, or Firm* — Novick, Kim & Lee, PLLC; Jae Youn Kim

(57) ABSTRACT

The present invention relates to a plating hanger device having a shock-absorbing structure and, more specifically, to a plating hanger device having a shock-absorbing structure, the device allowing a hanger to be transferred at a uniform speed and reducing noise and shock, which are generated during transferring, so as to enable a uniform plated layer to be formed on a substrate. According to the plating hanger device having the shock-absorbing structure, of the present invention, an elastic spring is pressed by the load of the plating hanger device and a jig, and sequentially, the elastic spring presses a connection shaft and the connection shaft presses a transfer housing so as to improve adhesion between the transfer housing and a driving gear, thereby enabling transferring at uniform speed, and reducing the noise and shock generated during transferring by means of the elastic spring.

4 Claims, 10 Drawing Sheets

(56) References Cited

FOREIGN PATENT DOCUMENTS

| | | | |
|---|---|---|---|
| JP | 2002-363796 | A | 12/2002 |
| KR | 10-2001-0072849 | B1 | 12/2003 |
| KR | 10-2011-0085281 | A | 7/2011 |
| KR | 10-2011-0101984 | A | 9/2011 |
| KR | 10-1472003 | B1 | 12/2014 |
| KR | 10-1637382 | B1 | 7/2016 |

\* cited by examiner

PLATING HANGER DEVICE HAVING SHOCK-ABSORBING STRUCTURE

TECHNICAL FIELD

The present invention relates to a plating hanger device having a shock-absorbing structure and, more specifically, to a plating hanger device having a shock-absorbing structure, the device allowing a hanger to be transferred at a uniform speed and reducing noise and shock, which are generated during transferring, so as to enable a uniform plated layer to be formed on a substrate.

BACKGROUND ART

In general, printed circuit boards are manufactured through a plurality of processes and manufacturing steps thereof are also very complex. Among them, a plating process, that is, a metallization process, plays a key role in providing current and voltage to electronic devices. In addition, in recent years, printed circuit boards have become smaller, thinner, and lighter, so the size of via holes connecting metal wires and electronic devices is becoming smaller, thus, a more uniform plating process is required. Further, in order to form a circuit or plate a via in the plating process for the printed circuit board, in general, a seed layer is formed through an electroless chemical plating process and then a metal layer is formed through an electroplating process. In addition, a technique for transferring the printed circuit board to perform a fixing process is also disclosed as in Korean Patent Application No. 10-2001-0072849.

In the plating process for the printed circuit board, a hanger is moved along a rail by a driving device, the jig is installed on the hanger, and the printed circuit board is fixed to the jig, so the printed circuit board is immersed in a water tank filled with a plating liquid and moved together with the hanger by the driving device to form a uniform plating layer.

However, in the structure of transferring the conventional printed circuit board, the hanger and the rail are coupled and moved by a rack gear. In the moving process, vibration or shaking occurs due to the engagement between gears, and the vibration is transferred to the hanger so that components of the hanger are released. For this reason, there is a problem that it is need to repeatedly repair the components. Further, since the vibration is transferred to the jig coupled to the hanger and the printed circuit board, there is a serious problem that the printed circuit board may be separated from the jig or a non-uniform plating layer may be formed.

The foregoing invention refers to the background of the art to which the present invention pertains, and does not mean the prior art.

DISCLOSURE

Technical Problem

The present invention has been made to solve the above-mentioned conventional problems, and an object of the present invention is to provide a plating hanger device having a shock-absorbing structure, in which an elastic spring is pressed by the load of the plating hanger device and a jig, and sequentially, the elastic spring presses a connection shaft and the connection shaft presses a transfer housing so as to improve adhesion between the transfer housing and a driving gear, thereby enabling transferring at uniform speed, and reducing the noise and shock generated during transferring by means of the elastic spring.

Technical Solution

The present invention provides a plating hanger device having a shock-absorbing structure, which is moved by a convey device including a guide table formed with a guide wall installed at an outer surface of a water tank and a rail housing installed on the guide table and provided thereon with driving gears, in order to move a jig to which a substrate immersed in the water tank is fixed, the plating hanger device including a transfer housing provided on a bottom surface thereof with a rack gear portion allowing the transfer housing to be guided and moved by the driving gears provided on the rail housing, formed in a top surface thereof with fastening holes, and formed in a lateral side thereof with a lifting elongation hole communicating with the fastening holes; a fixing block fitted into the lifting elongation hole to move up and down and provided at one end thereof with a connection shaft having a support bushing; an elastic spring inserted into the fastening hole to press the connection shaft; a finish panel fastened to a top surface of the fixing block to press the elastic spring; a base panel having a top surface on which the fixing block is fixed and a bottom surface having upper rollers allowing the base panel to be guided to a lateral side of the guide wall; a support unit including a fixing panel provided at one lateral side of the base panel and a support panel provided under the fixing panel; and a guide unit including a guide panel formed under the support panel, a connection panel formed at a lateral side of the guide panel and to which the jig is fixed, and a lower roller provided on a top surface of the guide panel and guided to a lateral side of the guide table.

In addition, one end of the finish panel may be disposed on the transfer housing while pressing the elastic spring such that an elastic space is formed between the finish panel and the top surface of the transfer housing.

In addition, the plating hanger device may further include a shock-absorbing elastic pipe inserted into the connection shaft; coupling grooves formed on an outer surface of the shock-absorbing elastic pipe; and a ball bearing coupled to the coupling groove.

In addition, the plating hanger device may further include a vibrating portion installed on a top surface of the finish panel of the transfer housing.

In addition, the plating hanger device may further include: a latching elongation groove formed on one end of the lifting elongation hole such that the support bushing is latched to the latching elongation groove; and lifting rollers provided on a friction surface of the latching elongation groove to prevent the support bushing from being subject to friction when the support bushing moves up and down.

Advantageous Effects

According to the plating hanger device having the shock-absorbing structure of the present invention, the elastic spring can be pressed by the load of the plating hanger device and the jig, and sequentially, the elastic spring can press the connection shaft and the connection shaft can press the transfer housing so as to improve adhesion between the transfer housing and the driving gear, thereby enabling transferring at uniform speed, and reducing the noise and shock generated during transferring by means of the elastic spring.

BEST MODE

[Mode for Invention]

Figure 1:
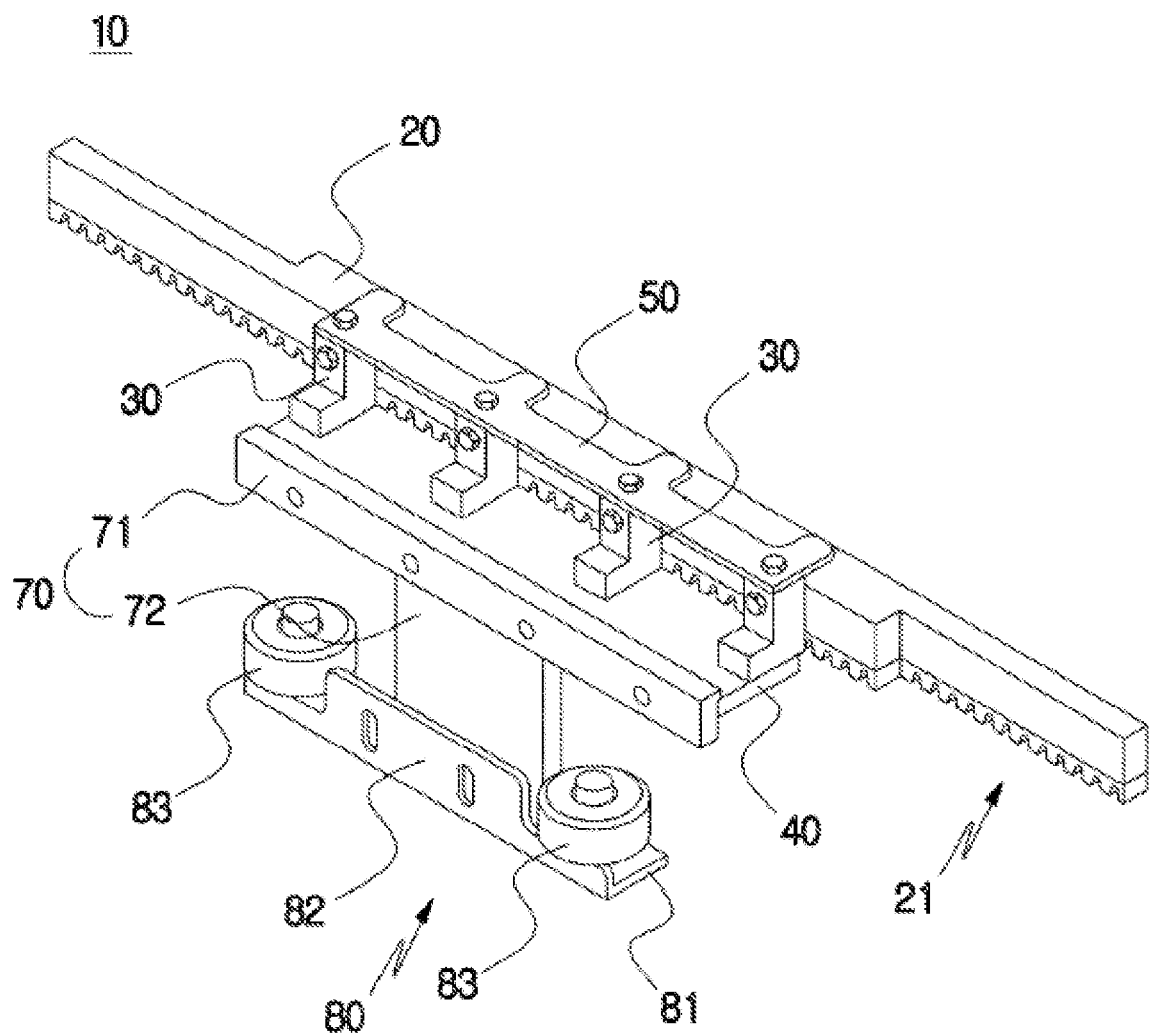
FIG. 1 is a perspective view showing a plating hanger device having a shock-absorbing structure according to the present invention.
Figure 2:
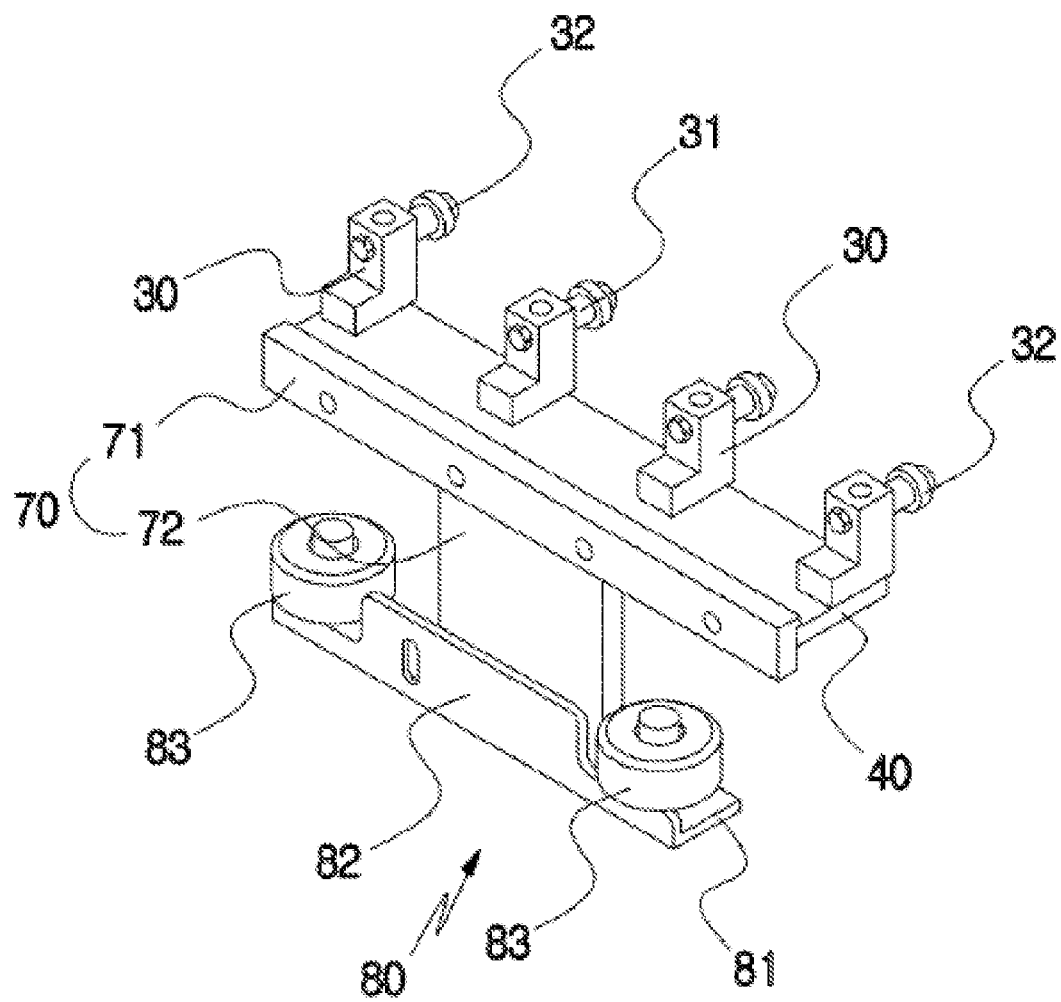
FIG. 2 is a view showing a plating hanger device having a shock-absorbing structure according to the present invention, in which a transfer housing is removed.
Figure 3:
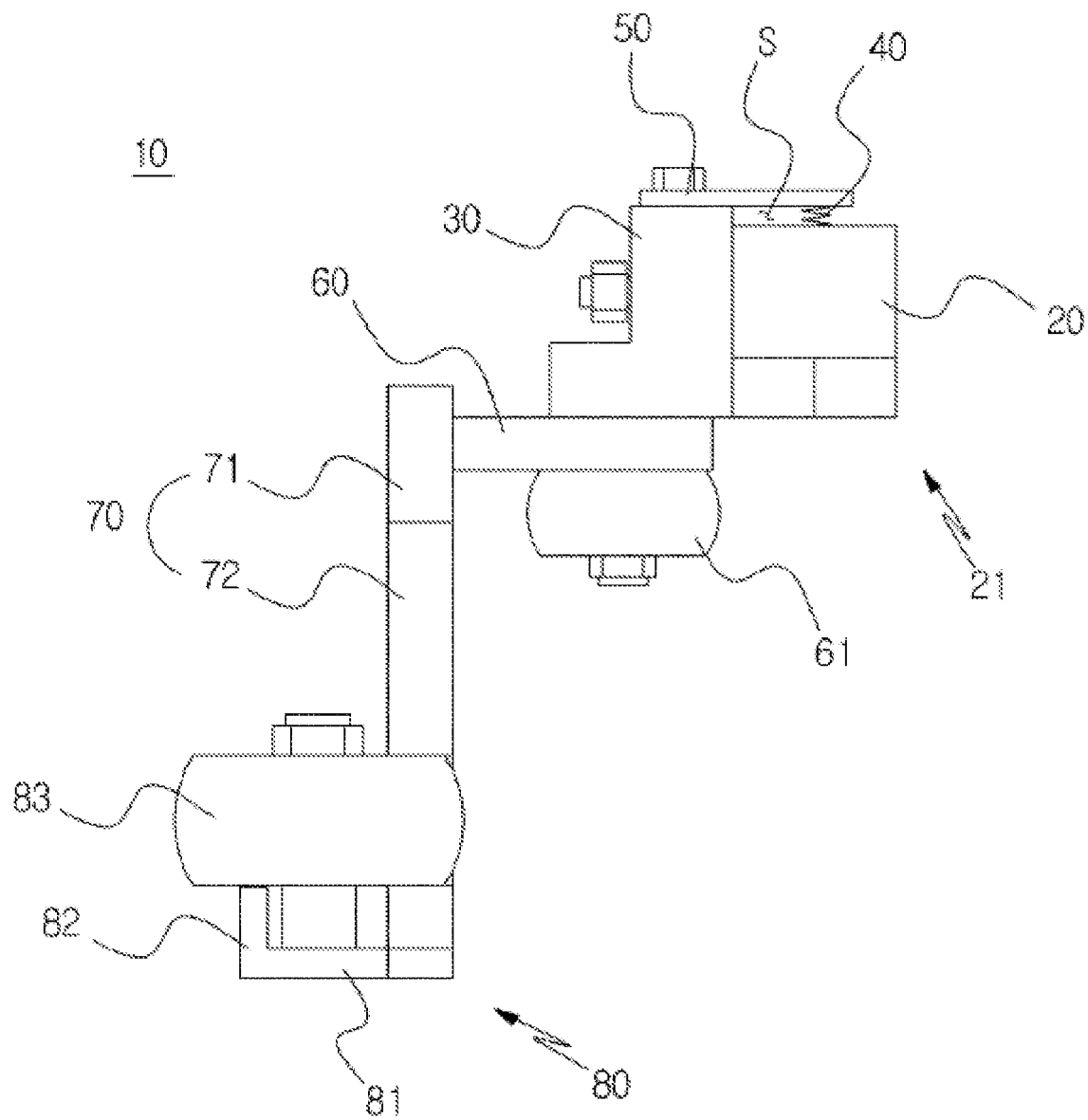
FIG. 3 is a side view showing a plating hanger device having a shock-absorbing structure according to the present invention.

Hereinafter, a plating hanger device having a shock-absorbing structure according to exemplary embodiments of the present invention will be described with reference to accompanying drawings. In the following description, the thickness of the lines or the size of the components shown in the drawings may be exaggerated for clarity and convenience of description. In addition, terms to be described below are terms defined in consideration of functions in the present invention, which may vary according to the intention or convention of a user or an operator. Therefore, definitions of these terms should be made based on the contents throughout the specification.

In addition, the following exemplary embodiments are not intended to limit the scope of the present invention, but are presented by way of examples, and there may be various embodiments implemented through the technical concept of the present invention.

As shown in the drawings, a plating hanger device 10 having a shock-absorbing structure (hereinafter referred to as "plating hanger device" for convenience of description) according to the present invention is moved by a convey device including a guide table 200, which is screwed or welded along an outer surface of a water tank 100 and a guide wall 210 is integrally formed with one side of a top surface of the guide table 200, and a rail housing 300 installed on the guide table 200 and provided on the top surface thereof with driving gears 310 and a driving motor 310 for driving the driving gears 310, in order to move a jig 400 to which a substrate immersed in the water tank 100 is fixed.

The plating hanger device 10 according to the present invention may include a transfer housing 20, a fixing block 30, an elastic spring 40, a finish panel 50, a base panel 60, a support unit 70, and a guide unit 80.

The driving motor 320 and the driving gears 310 may be installed on the rail housing 300 in a longitudinal direction while maintaining a predetermined interval, thereby transferring the plating hanger device 10 and the printed circuit board.

The transfer housing 20 may be formed of a metal material, provided on a bottom surface thereof with a rack gear 21 such that the transfer housing 20 can be guided and moved by the drive gears 310 installed on the rail housing 300, formed in a top surface thereof with fastening holes 22, and formed in a lateral side thereof a lifting elongation hole 23 communicating with the fastening holes 22.

The fastening holes 22 and the lifting elongation hole 23 may be configured to maintain a predetermined interval along the longitudinal direction of the transfer housing 20.

Figure 4:
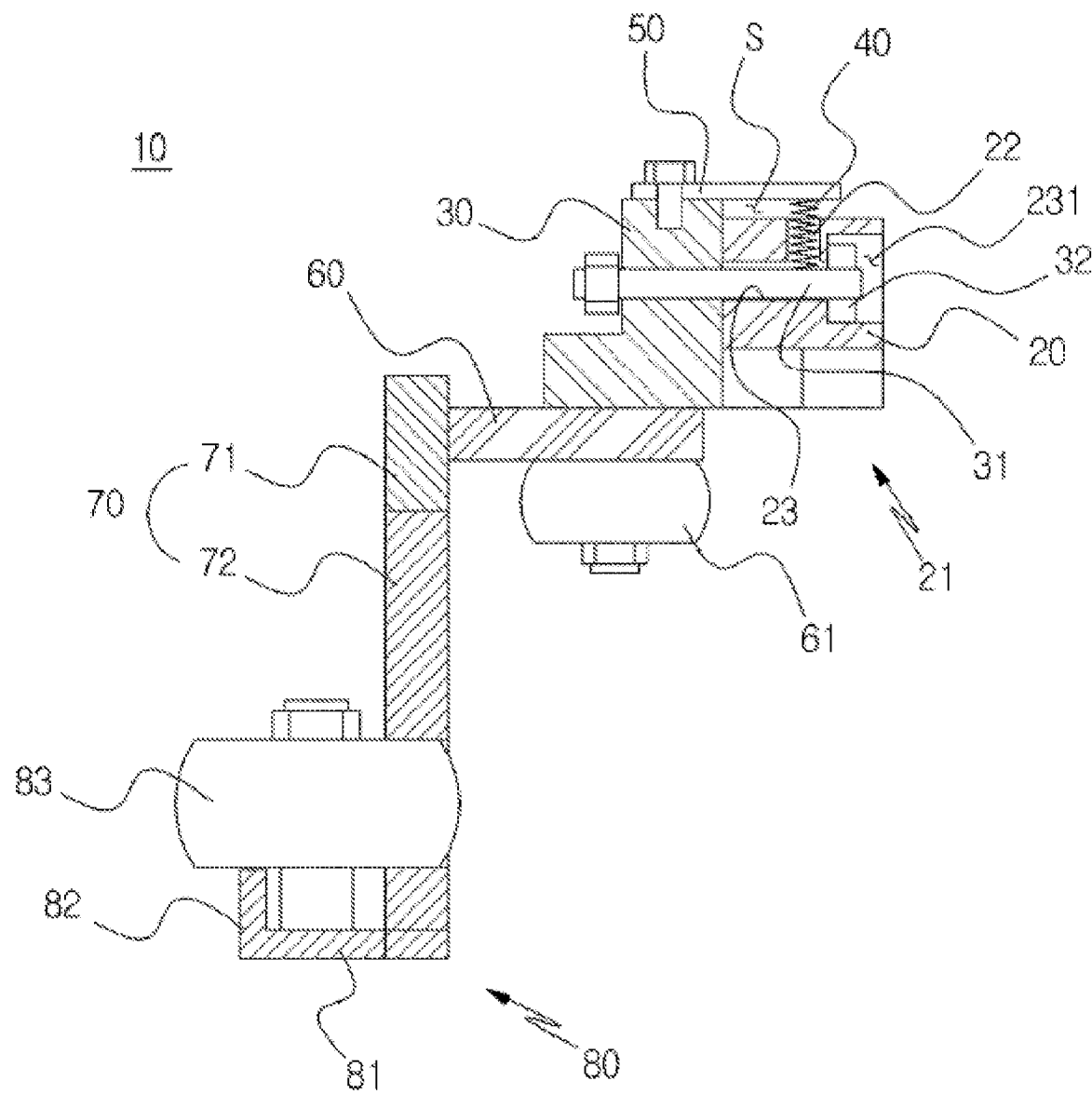
FIG. 4 is a sectional view showing a plating hanger device having a shock-absorbing structure according to the present invention.
Figure 5:
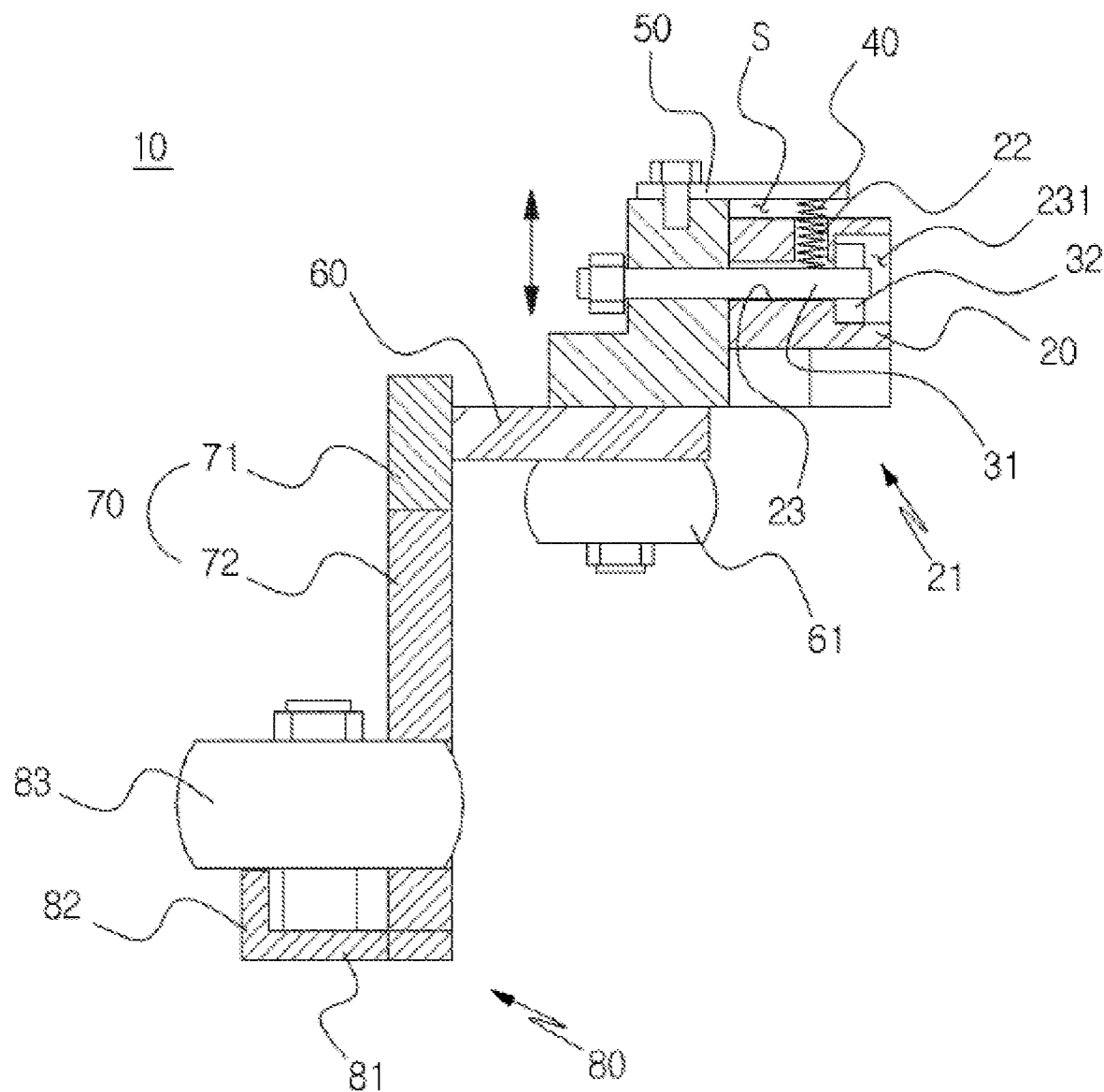
FIG. 5 is a view showing an operational state of a plating hanger device having a shock-absorbing structure according to the present invention.

As shown in FIG. 4, a latching elongation groove 231 may be further formed at one end of the lifting elongation hole 23 such that the support bushing 32 can be latched to the latching elongation groove 231 and moved up and down.

In this case, the latching elongation groove 231 may be configured to communicate with a lateral side.

The fixing block 30 may be fitted into the lifting elongation hole 23 and moved up and down, and has a connection shaft 31 provided at one end thereof with a support bushing 32.

The support bushing 32 may be fitted with the connection shaft 31 and then fixed thereto by welding or screwing, and disposed in the latching elongation groove 231 to prevent the connection shaft 31 from being separated from the lifting elongation hole 23.

As shown in FIG. 1, the fixing blocks 30 may be installed to the transfer housing 20 and fitted into the lifting elongation holes 23, respectively.

The elastic spring 40 may be fitted into the fastening hole 22 to press the connection shaft 31 disposed in the lifting elongation hole 23.

The finish panel 50 may connect the fixing blocks 30 and may be fixed to top surfaces of the fixing blocks 30 by screwing. Protrusion panels may be integrally formed at one end of the finish panel 50 to press the elastic spring 40.

The protrusion panels may support the connection shaft 31 and may be fitted into the fastening hole 22, and an upper end portion of the protrusion panel presses an upper portion of the elastic spring 40 protruding from the fastening hole 22.

The fixing blocks 30 may be provided on the top surface of the base panel 60 while maintaining a predetermined interval and fixed thereto by screwing or welding, and upper rollers 61 may be provided on the bottom surface of the base panel 60 such that the base panel 60 can be guided and latched to an outer surface of the guide wall 210.

The support unit 70 may include a fixing panel 71 which is screwed to one lateral side of the base panel 60 and a support panel 72 which is integrally formed with a lower portion of the fixing panel 71.

Figure 6:
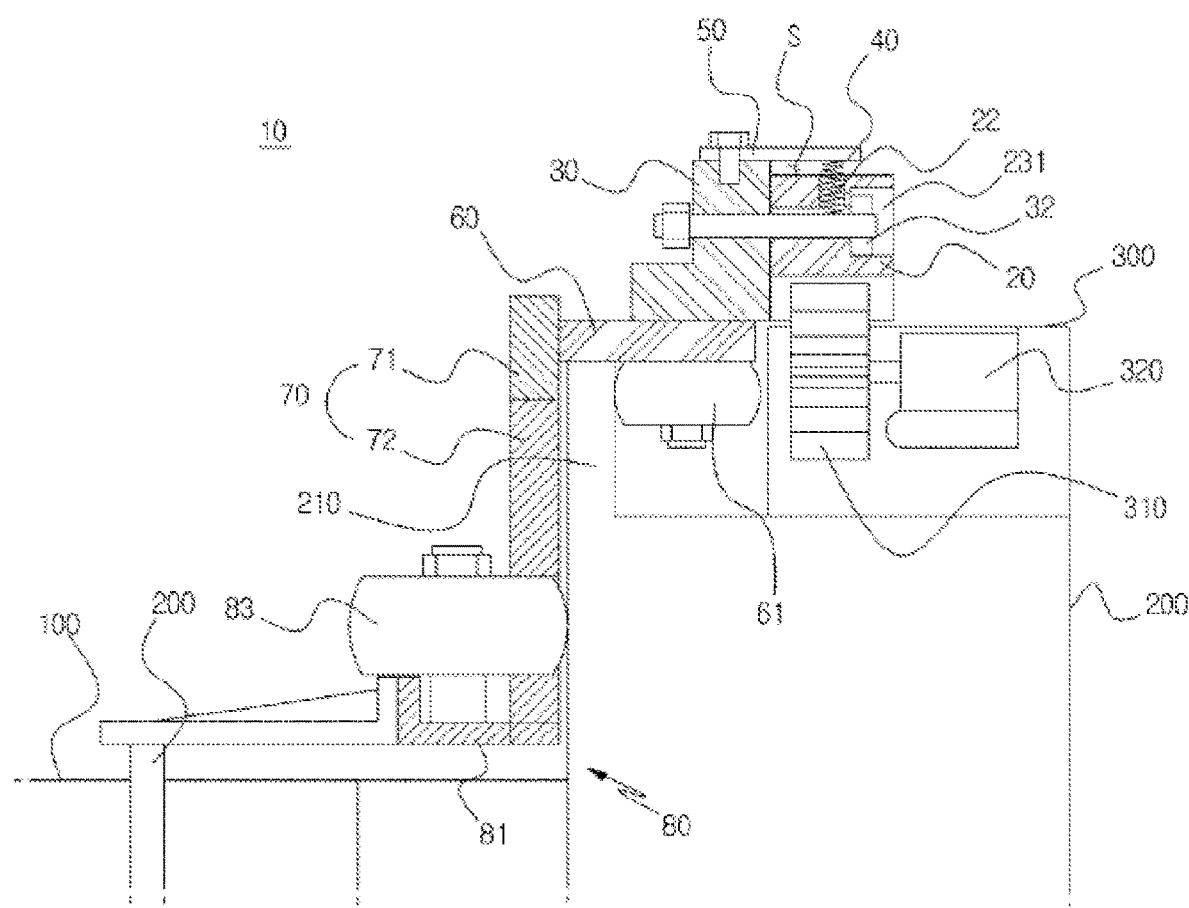
FIG. 6 is a view showing an installation state of a plating hanger device having a shock-absorbing structure according to the present invention.

As shown in FIG. 6, the fixing panel 71 and the support panel 72 may be disposed to face an inner surface of the guide wall 210.

The guide unit 80 may include a guide panel 81 provided under the support panel 72, a connection panel 82 provided at a lateral side of the guide panel 81 and to which the jig 400 is fixed, and a lower roller 83 provided on a top surface of the guide panel 81 and guided to the lateral side of the guide table 200.

The jig 400 may be formed of a frame or a framework having clamps, and the jig 400 may be moved in a state in which the jig 400 or a printed circuit board fixed to the jig 400 is immersed in the water tank 100 filled with a plating liquid while the printed circuit board is being fixed to the clamp.

In this case, one end of the finish panel 50 may be disposed on the transfer housing 20 while pressing the elastic spring 40 such that an elastic space S can be formed between the finish panel 50 and the top surface of the transfer housing 20. Thus, the fixing block 30 and the guide unit 80 may move up and down to the extent of the height of the elastic space S as shown in the drawings.

Rail protrusions may be provided at both lateral sides of the guide wall 210, and an annular rail groove may be further formed on the upper roller 61 and the lower roller 83 such that the rail protrusions may be guided while being fitted into the annular rail, so that the plating hanger device 10 can be prevented from being separated or moved from the driving gear 310 when a jam or a fluctuation occurs during the movement.

A "U" shaped elastic buffer hose may be further fastened to the rail groove to buffer the shock upon collision with the rail protrusion, and a ball bearing may be further fastened to an inner surface of the elastic buffer hose to reduce friction with the rail protrusion.

The operation of the plating hanger device 10 having the shock absorbing structure configured as described above is as follows. First, the printed circuit board is immersed in the water tank 100 filled with the plating liquid in a state in which the printed circuit board is fixedly clamped by the clamps of the jig 400. In a state in which the driving gear 310 is engaged with the rack gear 21, when the driving gear 310 is rotated by operating the driving motor 320, the plating hanger device 10 and the printed circuit board move along a plating bath and a plating layer is formed on the printed circuit board, thereby completing a series of processes.

In this case, the elastic spring 40 is pressed by the load of the printed circuit board, the jig 400, and the fixing block 30, the base panel 60, the support unit 70, the guide unit 80 and the finish panel 50 of the plating hanger device 10, so the elastic spring 40 sequentially presses the connection shaft 31 and the connection shaft 31 presses the transfer housing 20. Thus, the adhesion between the transfer housing 20 and the driving gear 310 can be improved so that it is possible move at a uniform speed and the noise generated during the transfer process can be reduced by the elastic spring 40. When the fluctuation occurs during the transfer process due to the jam between the rack gear 21 and the driving gear 310, the elastic spring 40 can absorb the shock.

Further, when the fluctuation occurs during the transfer process due to the jam of foreign matters or latching phenomenon between the rack gear 21 and the driving gear 310, the connection shaft 31 and the latching bushing are moved up and down along the lifting elongation hole 23 and the latching elongation groove 231 and returned by the pressing of the elastic spring 40, so that the shock can be absorbed. Thus, it is possible to solve the problem such as the bending or breakage of the connection shaft 31 which is caused due to the load accumulated in the connection shaft 31 when the connection shaft 31 is fixed to the fixing block 30 other than allowing the connection shaft 31 to move up and down and to be returned by elasticity.

It is also possible to further insert a magnetic bar inside the rack gear 21 so that the plating hanger device 10 presses the driving gear 310 while making close contact with the driving gear 310 by magnetic force of the magnetic bar.

Figure 7:
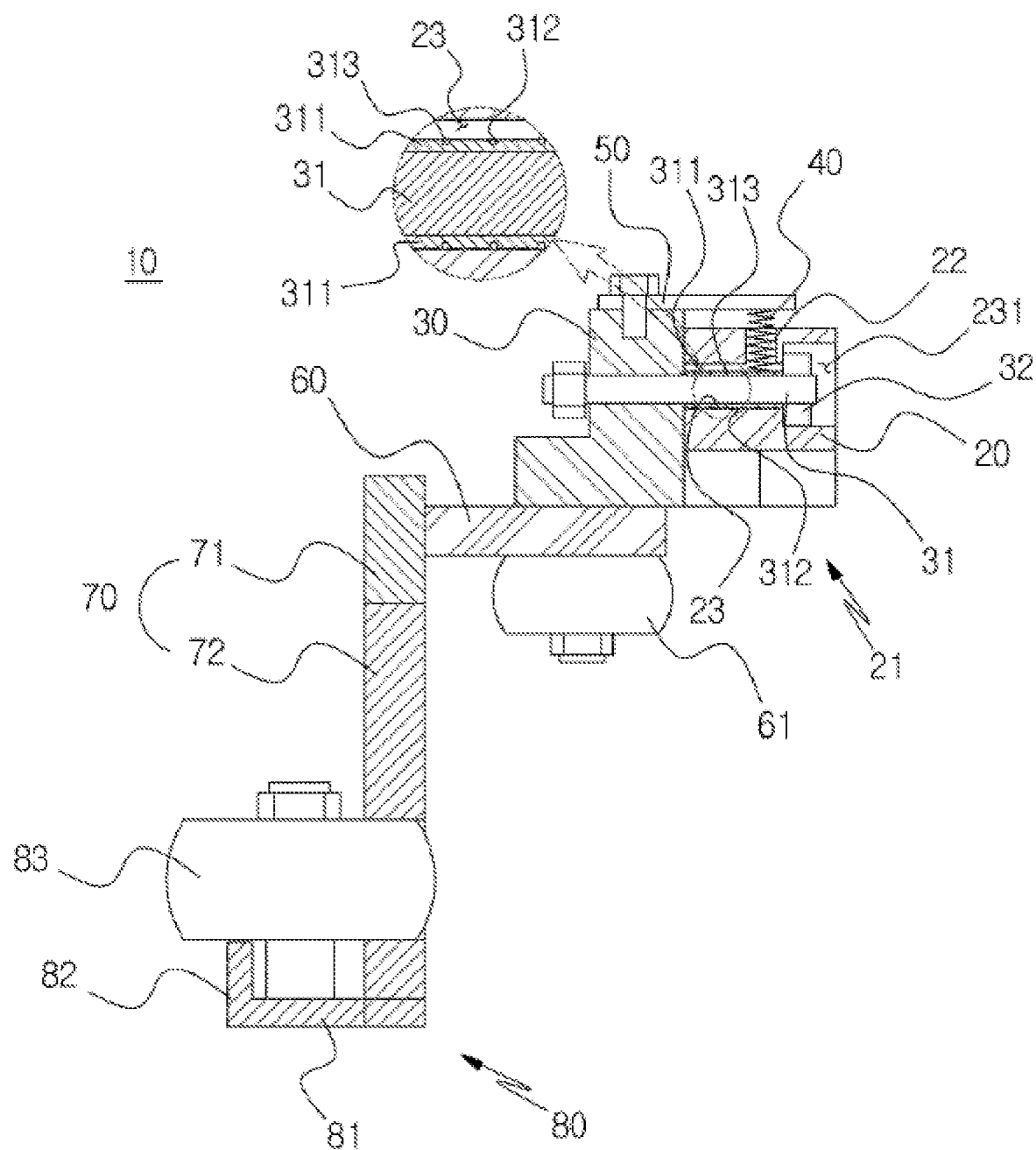
FIG. 7 is a view showing a plating hanger device having a shock-absorbing structure according to another embodiment of the present invention.

Referring to FIG. 7, a buffer elastic pipe 311 is further fitted with the connection shaft 31, coupling grooves 312 are formed on an outer surface of the buffer elastic pipe 311, and a ball bearing 313 is fastened to the coupling groove 312.

That is, the buffer elastic pipe 311 formed of a synthetic resin material having elasticity is fitted with the connection shaft 31 so as to prevent the connection shaft 31 from being subject to the collision by vibration when the connection shaft 31 moves up and down in the lifting elongation hole. Thus, the shock caused by the collision can be buffered, and the connection shaft 31 can be prevented from making friction with the lifting elongation hole 23 when the connection shaft 31 moves up and down by the ball bearing 313.

Figure 8:
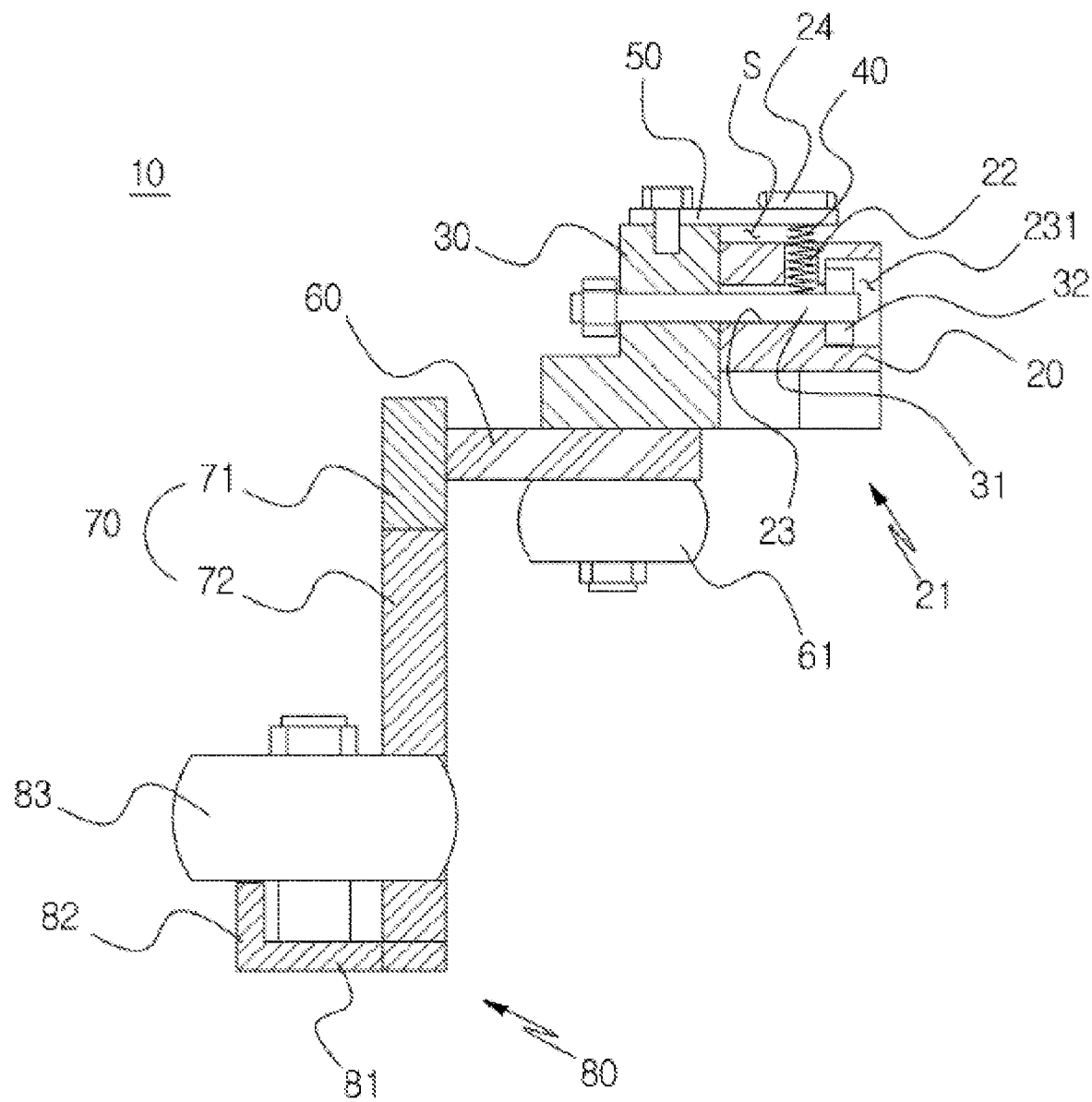
FIG. 8 is a view showing a plating hanger device having a shock-absorbing structure according to still another embodiment of the present invention.

Referring to FIG. 8, a vibrating portion 24 is further screwed or welded to the top surface of the finish panel 50 of the transfer housing 20.

The vibrating portion 24 is a vibrator and the vibration of the vibrator 24 is transmitted to the jig 400 and the printed circuit board to form a uniform plating layer on the printed circuit board, and the vibration is transferred to the transfer housing 20 to prevent the rack gear 21 and the driving gear 310 from being latched with each other.

Figure 9:
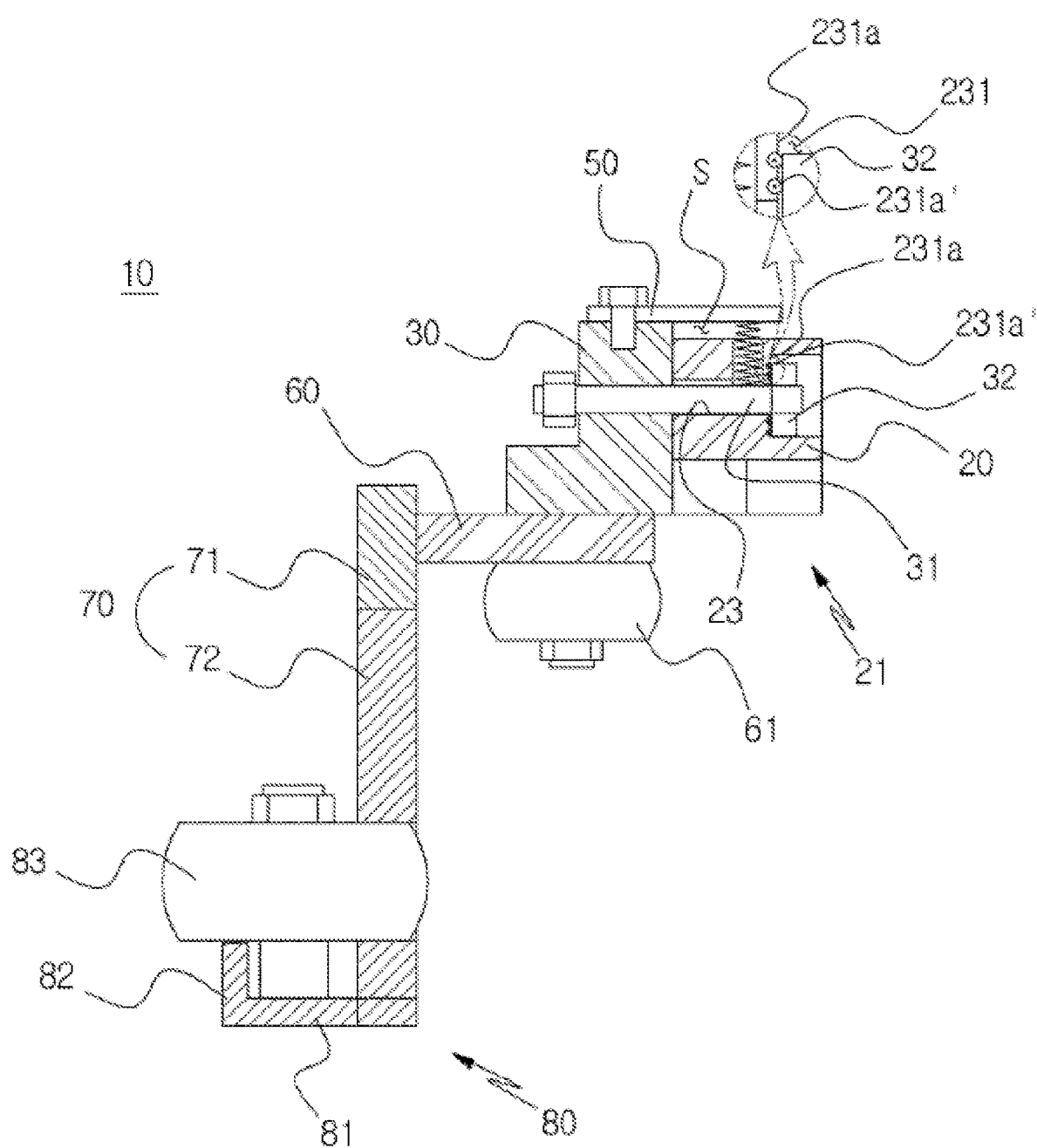
FIG. 9 is a view showing a plating hanger device having a shock-absorbing structure according to still another embodiment of the present invention.

Referring to FIG. 9, the latching elongation groove 231 is further formed at one end of the lifting elongation hole 23 so that the support bushing 32 can be disposed to latch with the latching elongation groove 231 and lifting rollers 231a' are further provided on a friction surface 231a of the latching elongation groove 231 to prevent the friction when the support bushing 32 moves up and down, so that the support bushing 32 can be prevented from being latched to or rubbed with the friction surface 231a due to the shock or vibration when the support bushing 32 moves up and down together with the connection shaft 31.

Figure 10:
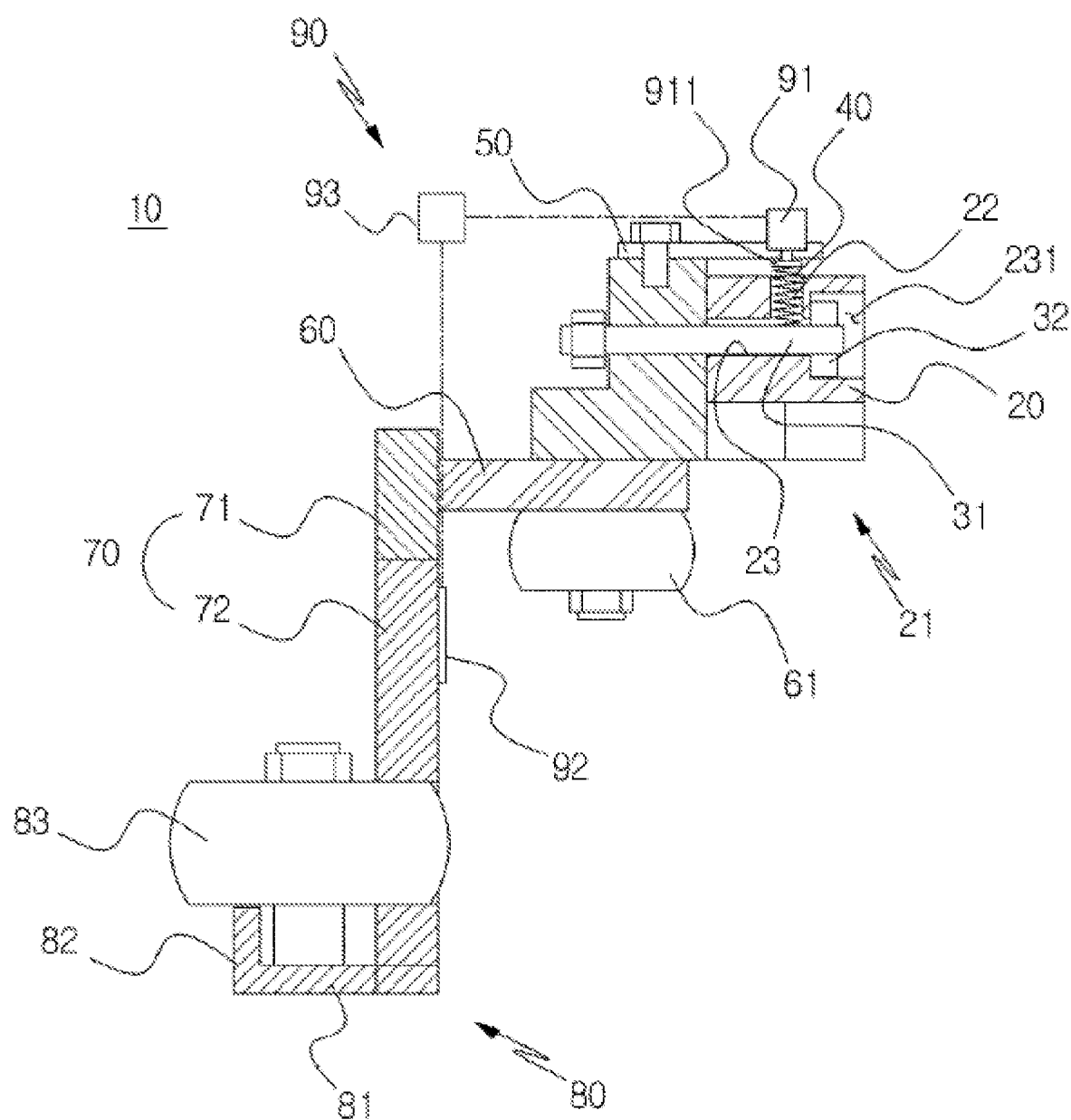
FIG. 10 is a view showing a plating hanger device having a shock-absorbing structure according to still another embodiment of the present invention.

Referring to FIG. 10, a uniform pressing device 90 is further installed, in which the uniform pressing device 90 presses the elastic spring 40 by detecting the position of the plating hanger device 10 when the fluctuation or jam occurs during the transfer process, thereby enhancing the adhesion and preventing separation between the transfer housing 20 and the drive gear 310. The uniform pressing device 90 includes a pressing cylinder 91 installed on the finish panel 50, a position detection sensor 92 provided on the support panel 72, and a control unit 93 provided in the plating hanger device 10 to drive the pressing cylinder 91 by receiving a signal of the position detection sensor 92, in which a pressing panel 911 is further installed on a pressing shaft of the pressing cylinder 91 to press an upper portion of the elastic spring 40.

That is, when the position detection sensor 92 detects that the position of the plating hanger device 10 is higher than the height of the guide wall 210 during the transfer process, the signal is sent to the control unit 93 and the control unit 93 controls the pressing cylinder 91 to press the elastic spring 40, so that the rack gear 21 of the transfer housing 20 is brought into close contact with the driving gear 310 to return the plate hanger device 10 in position.

In addition, the plating hanger device 10 may be further provided with a wireless transmission unit for receiving and transmitting a signal from the control unit 93 to allow an operator to recognize and repair the jam or the fluctuation during the transfer process.

One embodiment of the present invention described above is merely exemplary, and those skilled in the art will appreciate that various modifications and equivalent other embodiments are possible therefrom.

INDUSTRIAL APPLICABILITY

The present invention can be used in industry because the present invention can be applied to the plating hanger device for plating a substrate.

The invention claimed is:

1. A plating hanger device having a shock-absorbing structure, which is configured to be moved by a conveying device including a guide table having a guide wall disposed at an outer surface of a water tank and a rail housing disposed on the guide table, the plating hanger device comprising:
   a transfer housing having a rack gear portion on a bottom surface thereof to allow the transfer housing to be guided and moved by driving gears disposed on the rail housing, having a fastening hole formed on a top surface thereof, and having an elongation hole formed on a lateral side thereof for communicating with the fastening hole;
   a fixing block fixed to the transfer housing by disposing a connection shaft in the elongation hole through a hole in the fixing block, the connection shaft having a support bushing at one end thereof;
   an elastic spring disposed in the fastening hole;
   a finish panel fixed to a top surface of the fixing block;
   a base panel having a top surface on which the fixing block is fixed and a bottom surface on which an upper roller is positioned to be guided on a lateral side of the guide wall;
   a support unit including a fixing panel disposed at one lateral side of the base panel and a support panel disposed under the fixing panel; and
   a guide unit including a guide panel disposed under the support panel, a connection panel disposed at a lateral side of the guide panel, and a lower roller disposed on a top surface of the guide panel to be guided on a lateral side of the guide table,
   wherein the finish panel has an end portion fixed to the top surface of the fixing block and a protruding portion protruding from the top surface of the fixing block to be disposed in parallel with the connection shaft to form a space between the finish panel and the top surface of the transfer housing, and
   wherein the elastic spring has a top end pressing a bottom surface of the protruding portion of the finish panel and a bottom end pressing an upper surface of the connection shaft.

2. The plating hanger device of claim 1, further comprising:
   a buffer elastic pipe surrounding the connection shaft;
   a coupling groove formed on an outer surface of the buffer elastic pipe; and
   a ball bearing coupled to the coupling groove.

3. The plating hanger device of claim 1, further comprising:
   a vibrator disposed on a top surface of the finish panel of the transfer housing.

4. The plating hanger device of claim 1, further comprising:
   a latching elongation groove formed on one end of the elongation hole such that the support bushing is latched to the latching elongation groove; and
   a lifting roller disposed on a friction surface of the latching elongation groove to prevent the support bushing from being subject to friction when the support bushing moves up and down.

* * * * *